United States Patent
Lender, Jr. et al.

(10) Patent No.: US 7,924,097 B2
(45) Date of Patent: Apr. 12, 2011

(54) SOLID-STATE ULTRA-WIDEBAND MICROWAVE POWER AMPLIFIER EMPLOYING MODULAR NON-UNIFORM DISTRIBUTED AMPLIFIER ELEMENTS

(75) Inventors: Robert J. Lender, Jr., Pepperell, MA (US); Robert Actis, Hudson, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 1159 days.

(21) Appl. No.: 11/629,025

(22) PCT Filed: Nov. 1, 2005

(86) PCT No.: PCT/US2005/039407
§ 371 (c)(1),
(2), (4) Date: Dec. 8, 2006

(87) PCT Pub. No.: WO2006/057774
PCT Pub. Date: Jun. 1, 2006

(65) Prior Publication Data
US 2009/0309659 A1    Dec. 17, 2009

Related U.S. Application Data

(60) Provisional application No. 60/630,343, filed on Nov. 23, 2004.

(51) Int. Cl.
*H03F 3/60* (2006.01)
(52) U.S. Cl. .......................... 330/286; 330/54
(58) Field of Classification Search .................. 330/286, 330/54, 295, 124 R
See application file for complete search history.

(56) References Cited

U.S. PATENT DOCUMENTS

| | | | |
|---|---|---|---|
| 4,486,719 A | 12/1984 | Ayasli | |
| 4,543,535 A | 9/1985 | Ayasli | |
| 4,733,195 A | 3/1988 | Tserng et al. | |
| 4,754,234 A | 6/1988 | Gamand | |
| 4,788,511 A | 11/1988 | Schindler | |
| 5,028,879 A | 7/1991 | Kim | |
| 5,046,155 A | 9/1991 | Beyer et al. | |
| 5,485,118 A * | 1/1996 | Chick | 330/52 |
| 6,674,329 B1 * | 1/2004 | Stengel et al. | 330/286 |
| 2008/0090539 A1 * | 4/2008 | Thompson | 455/250.1 |

* cited by examiner

*Primary Examiner* — Henry K Choe
(74) *Attorney, Agent, or Firm* — Daniel J. Long; Robert K. Tendler

(57) ABSTRACT

A number of identical non-uniformly distributed ultra-wideband power amplifier string building blocks are coupled together to form an ultra-wide bandwidth high-power amplifier. The non-uniform distribution results in an amplifier utilizing modular string building blocks that have input and output impedances with only real values. This permits the strings to be replicated and connected together with simple impedance matching. The internal impedance matching associated with the non-linear distribution also absorbs parasitic capacitance to permit the ultra-broadband operation. In one embodiment identical transistors are used for each cell so that the strings may be identically replicated. This permits modular re-use without reconfiguration. In one embodiment a non-uniform distributed power amplifier built using the subject building blocks provides an ultra-wideband multi-octave device suitable for electronic warfare and communications applications, especially to replace traveling wave tubes.

19 Claims, 13 Drawing Sheets

$$f_c = \frac{1}{\pi\sqrt{LC}}$$

SOLID-STATE ULTRA-WIDEBAND MICROWAVE POWER AMPLIFIER EMPLOYING MODULAR NON-UNIFORM DISTRIBUTED AMPLIFIER ELEMENTS

RELATED APPLICATIONS

This Application claims rights under 35 USC §119(e) from U.S. Application Ser. No. 60/630,343 filed Nov. 23, 2004, the contents of which are incorporated herein by reference.

FIELD OF THE INVENTION

This invention relates to solid-state microwave power amplifiers and more particularly to achieving multi-octave frequency bandwidths using non-uniformly distributed amplification modular building blocks.

BACKGROUND OF THE INVENTION

Ultra-wide bandwidth power amplifiers that can, for instance, produce 100-watt microwave outputs in the past have utilized traveling wave tubes. One application for such high-power microwave traveling wave tube amplifiers is in electronic warfare to countermeasure radar-based seekers by emitting jamming signals. In many of these applications a traveling wave tube amplifier is towed in a vehicle behind an aircraft and is provided with a high-voltage source to run the traveling wave tube. Control and modulating signals are also coupled to the towed vehicle for jamming and decoy purposes.

Typical operational requirements include the ability to produce high-power microwave signals from 2 GHz to 18 GHz to accommodate a variety of threats.

However, there are serious limitations in such decoys or jammers due to the use of the traveling wave tubes themselves. First and foremost, the traveling wave tubes are unreliable, difficult to manufacture, and are scarce at best. Secondly, these tubes require high voltages, which for a towed vehicle, must be supplied inside an optical fiber towline that must have high tensile strength and flexibility; be lightweight; and capable of being spooled without kinking.

Additionally, for jamming or countermeasure purposes, oftentimes it is required to turn the amplifier on and off in nanosecond time frames, which traveling wave tubes cannot accommodate. Moreover, if the traveling wave tube is not left on, it must be powered up, involving considerable warm-up time.

For communications purposes, oftentimes it is required to be able to frequency-hop across multiple octaves of frequency and yet provide sufficient communication power levels. An ultra-wideband high-power amplifier is highly desirable for such applications.

In order to eliminate the problems associated with traveling wave tube microwave power amplifiers, there have been efforts in the past to eliminate the tube and provide solid-state devices. Some have suggested using solid-state amplifiers that employ distributed amplification using a number of small amplifiers in small unit cells that are operated in parallel in an effort to obtain high power. However, for high power applications, the power is limited by the power handling capability of the final active device in the distributed structure. In addition these distributed structures do not provide the total aggregate power available from each of the small unit cells in high power applications (i.e., N unit cells do not provide N×the power per unit cell).

To illustrate, in providing, for instance, 100 watts of power, one would need to have active devices that are relatively large. However, relatively large devices, although available, have ever-increasing parasitics. As a result, when one parallels these additional cells to increase the power level, the parasitics multiply, the impedance Of the device is reduced and the internal cutoff frequency of the distributed amplifier is lowered. All of these factors serve to reduce the power-bandwidth product of the amplifier.

Thus the reasons for the non-use of conventional uniformly distributed amplification in power amplifiers have been the limitations on the size of the transistors to limit parasitic problems, the limited operating frequency range because of the parasitics and the sub-optimal loading of the transistors, and the suboptimal transistor combining for high power applications.

Additionally, one-dimensional uniformly distributed solid-state microwave amplifiers have a gate line termination and a drain line termination. Gate line termination does not affect amplification. However, the drain line termination reduces the power available to the load and thus ultimately limits the output power of the amplifier.

In many applications the use of the drain resistor wastes up to 50% of the power. The reason that one utilizes a termination in the drain line is to eliminate the reverse traveling wave so that the amplifier is well matched over broad frequency bandwidths.

Moreover, there is another problem with prior uniformly distributed amplifiers. In these amplifiers each cell's amplification varies with frequency primarily due to unmatched capacitances. What makes capacitance matching so difficult in conventional distributed amplifiers is that the load line for each cell is different. The problem is that over different parts of the frequency range that one wishes to cover, one device will be optimally loaded and other devices will be sub-optimally loaded. Thus the maximum power output of each cell is not delivered.

Further, each transistor in the uniformly distributed amplifier is typically of a different size with different associated capacitance. This makes internal matching difficult and one has to tailor the matching for each different amplifier. The primary reason for the use of different-size transistors is to handle the output power from a previous cell. In order to handle the high power at the end of the string, these distributed amplifiers use transistors of ever-increasing size. However, this presents different and increasing capacitances.

Because of parasitic capacitance over wide frequency ranges the voltages and currents in each of the cells of the uniformly distributed amplifiers are different, such that each cell would be loaded slightly differently. As mentioned above, the power delivered by each of the transistors would not be maximized. What this means is that, at one part of the frequency band, one transistor would be delivering more power than the other, whereas at a different portion of the frequency band a different transistor would be delivering more power. Thus in a solid-state uniformly distributed microwave amplifier architecture, one could not achieve a flat or fixed output power across multiple octaves in which the power level is equal to the maximum power available from each transistor.

In an effort to solve some of the above problems, U.S. Pat. No. 5,485,118, Non-Uniformly Distributed Power Device, by Richard Chick, issued Jan. 16, 1996, utilizes a two-dimensional array of cells and a very complicated method for distributing the cells. Aside from the complicated requirements for impedance matching, the array of distributed transistors mandates crossover interconnections in both gate and drain circuitry. Because of the crossovers the Chick amplifier is virtually impossible to build utilizing Monolithic Microwave Integrated Circuits (MMICs). This is due to the fact that the interconnection of the cells is always accomplished in one plane. While there are techniques such as an air bridge that permit crossovers, the techniques oftentimes do not have the current-handling capability required for high-power operations. Thus the two-dimensional Chick amplifier was not realizable.

Chick does discuss a one-dimensional, 1-D approach using non-uniform distribution but rejects the 1-D approach in favor of this two-dimensional approach to obtain the broadest theoretical bandwidth. Also, rather than using identical building blocks and coupling them together to achieve the desired amplification, Chick opts for a matrix or grid that requires very complicated reactance compensation between the amplifier tiers or sections. Because of the complicated reactance compensation between amplification stages it was not clear that there could be a simple replication of the distributed amplifier system to achieve high power broadband amplification.

Rather, Chick achieves amplification through arranging a number of devices and adjusting the coupling between the devices in a sensitive tweaking process involving painstaking adjustments to capacitance and inductance associated with each of the cells. Once adjusted, any circuit changes or additions require a further tailored adjustment. Physical layout constraints further complicate this process and limit performance.

Thus Chick does not envision using replicated non-uniform distributed amplifier strings as building blocks coupled together to obtain high power and ultra-wide bandwidth.

Other patents relating to distributed amplifiers are: U.S. Pat. No. 4,733,195, Travelling-Wave Microwave Device, by Hua Q. Tserng et al., issued Mar. 22, 1988; U.S. Pat. No. 4,788,511, Distributed Power Amplifier, by Manfred J. Schindler, issued Nov. 29, 1988; U.S. Pat. No. 4,543,535, Distributed Power Amplifier, by Yalcin Ayasli, issued Sep. 24, 1985; U.S. Pat. No. 4,486,719, Distributed Amplifier, by Yalcin Ayasli, issued Dec. 4, 1984; U.S. Pat. No. 5,046,155, Highly Directive, Broadband, Bidirectional Distributed Amplifier, by James B. Beyer et al., issued Sep. 3, 1991; U.S. Pat. No. 4,754,234, Broadband Distributed Amplifier for Microwave Frequencies, by Patrice Gamand, issued Jun. 28, 1988; and U.S. Pat. No. 5,028,879, Compensation of the Gate Loading Loss for Travelling Wave Power Amplifiers, by Bumman Kim, issued Jul. 2, 1991.

In short, there still remains a need for realizable broad bandwidth power amplifiers in the 2-18 GHz range without utilizing traveling wave tubes.

SUMMARY OF INVENTION

The subject high-power solid-state amplifier, implemented with MMIC technology, involves the interconnection of modular non-uniformly distributed amplifier building blocks to achieve the desired wideband amplification. It has been found that non-uniformly distributed amplifier strings have only real input and output impedances. Therefore they can be easily replicated and used as building blocks with standard impedance transformers so that they can be connected either in parallel for added power or cascaded for added gain. It has also been found that unlike the Chick system such building block combinations provide multi-octave bandwidths. Moreover, it has been found that the power output can be held to within +/−0.5 dB over the entire frequency range.

Thus depending on the topology a wide variety of circuit combinations is possible without having to deal with reactive components. This means that one can achieve as much as 100 watts with a greater-than three-octave bandwidth, making the combination of the strings an ideal replacement for traveling wave tubes.

In one embodiment each building block is a distributed amplifier having a number of small unit cells arranged in a string in which the impedances associated with the cells are non-uniform. This non-uniform impedance distribution has a number of advantages.

First, the amplifier does not use a drain line termination, which removes this as a source of output attenuation.

Second, the non-uniform impedance distribution results in an input and output to the string having only real impedance values. This facilitates connecting the strings together with simple impedance transformers, with the string serving as a modular building block.

Third, parasitic capacitance is absorbed so that the string of cells has an ultra-wide bandwidth.

Fourth, for the building blocks only the inductance and phase relationship between the cells is adjusted, with the capacitance being constant, which permits using identical transistors in all stages.

Fifth, the current/voltage characteristics of each cell are made equal to facilitate maximum power transfer and matching between strings, which simplifies manufacturing.

Sixth, by connecting together the building blocks it is possible to achieve high power outputs that are absolutely flat across the entire bandwidth. This permits designs that require stable ascertainable output levels and enables interconnection of multiple strings to achieve the desired power output over the ultra-wide frequency band.

Seventh, since the only variable elements are the inductor and the transmission line length, and since the inductor and transmission line are microstrip traces, one can also use the trace topology to phase match between cells. Note for the drains, the associated inductance successively decreases from input to output, with gate inductance increasing from input to output. In both cases the inductors are formed by traces. Moreover, coiled inductances that cannot handle high current can be avoided.

More particularly, characterizing the distributed amplifier string as an artificial transmission line, it is noted that the characteristic impedance of the artificial transmission line is made to vary throughout the distributed amplifier so that in the subject system the voltage/current characteristics of each unit cell are identical.

This identical voltage/current characteristic of each of the cells is brought about by assigning impedances between the cells (i.e. branches) in a non-uniform manner such that the branch impedance between any two cells is not equal to the branch impedance between the next adjacent branch.

Because of the non-uniform distribution in the string that results in the equal voltage/current characteristics for the cells, the input impedance and the output impedance have only real values. In short, there are no imaginary components, which makes it possible to take each of the distributed amplifier strings and couple them together for power amplification purposes using simple impedance matching.

Once having engineered a non-uniform distributed power amplifier string, these strings can be cookie-cuttered or replicated and connected together in a variety of different ways without having to take into account imaginary impedance components. This makes impedance matching relatively simple.

As mentioned hereinbefore, in order to achieve maximum power transfer from each transistor in the amplifier, one constrains all of the transistor cells to have the same voltage and the same current at all frequencies of operation. It turns out that the same voltage and the same current can be made to flow through the transistors by changing the characteristic impedance of the lines between the transistors (i.e., branches). When this is done non-uniformly and correctly, it turns out that one does not need the dummy load on the drain of the amplifier.

In one embodiment, one changes the impedance characteristics of the cells by changing the value of the inductors throughout the string. Given that one chooses to hold the capacitance, C, at some fixed value called the ideal value, the above constraints are achieved by changing the inductance, L, for each cell.

However, by changing L for each cell, the cutoff frequency is not equal at each stage or each step along the artificial transmission line.

This is not a problem because one can choose the number of transistors and the size of the transistors in the string such that the associated cutoff frequencies are still higher than the design cutoff frequency.

Although changing the inductor for a given cell may result in one cell operating sub-optimally as far as the frequency cutoff is concerned, one can still maintain a very broad bandwidth device because one can maintain the majority of the cutoff frequencies above the operating range of the amplifier.

Thus rather than using traveling wave tubes in which there is a reliability issue in that the tubes do not last long enough; in which for some applications one has to turn the RF energy off, resulting in warm-up time problems; and in which one cannot switch in nanosecond time frames, and rather than having a high-voltage requirement, in the subject invention the non-uniform distributed power amplifiers have none of the above problems. They typically can operate with a multi-octave bandwidth and can be designed to have input and output impedances that are real. Additionally, no drain loads are required that would attenuate the output of the amplifiers strings.

Most importantly, when one combines the power amplifier strings because of the real input and output impedances, one does not have to tune out reactance when matching between the strings. This is because one has already tuned out the reactance within the string.

Thus the string, which is essentially an internally matched device, becomes a modular building block and operates in an ultra-wideband fashion up to the design cutoff frequency.

It is, of course, true that one could utilize these building blocks either over the full bandwidth or a more limited bandwidth. As will be appreciated, one can operate over a narrower bandwidth to minimize matching losses that are proportional to the bandwidth.

Thus it is possible that a very wide internally matched cell can be used at any point, either over a narrow or wide the frequency range.

If one has a particular-size transistor, then its gain characteristic is a function of frequency. Large devices have a fairly wide variation of imaginary impedance associated with the device, which means that one has to tune the imaginary impedance out if one is going to use the device over a wide frequency. The interesting trait in the subject invention is that if one uses a non-uniform distributed power amplifier string that is equivalent to the same size periphery of a conventional device, it does not have a very large impedance variation with frequency. This means that the characteristic impedance is very localized on the impedance plane. What this says is that over frequency, the string is essentially at one impedance value. Thus the non-uniform distributed power amplifier string is constrained to essentially a single real impedance value so that when one decides to couple the individual power amplifiers together, it is a lot easier to realize.

This enables aggregating several strings and putting them into a realizable piece of gallium arsenide, gallium nitride, silicon carbide, or indium phosphide so that one can actually build large, high-power amplifiers over wide bandwidths.

With respect to multiband communications requirements, utilizing the subject non-uniform distributed power amplifiers can mean providing only one amplifier where multiple amplifiers were necessary to cover the bands of interest. Thus, one can simplify the entire front-end requirement if one has a single amplifier that covers all of the frequencies involved.

Moreover, with communications amplifiers, as one increases frequency into millimeter waves, the parasitics become even more of a problem. By paralleling up devices, which is how one would conventionally build a high-efficiency millimeter wave amplifier, it is very difficult to maintain more than about 10% in bandwidth.

Rather than utilizing higher-voltage transistors, if one uses a millimeter wave version of the non-uniform distributed power amplifier, one can achieve close to 20 to 25% bandwidth with the same total gate periphery as one would use for a reactive match amplifier, which only has about a 10% bandwidth. It is noted that with the subject millimeter wave version of the non-uniform distributed power amplifier, one has a power and efficiency that are as good as with the reactive match, except over a much broader bandwidth. This is because in using the internally matched cells, one is basically doing a parasitic absorption in the transmission line.

In one embodiment useful in electronic warfare, the high output power over 4 to 18 GHz is a flat 4-plus watts within a half-a-dB over the entire frequency range. The ability to have a uniform power output capability over such a wide range is impressive and permits one to utilize these building block elements through multiple iterations to provide an absolutely flat and ascertainable wideband output. The net result is one that is able to re-use the strings for drivers and follow-on amplification stages in a modular cookie-cutter approach.

Thus once one has designed a string, it becomes the basis of generating a whole family of amplifiers in terms of both frequency and power level. One simply adds more strings in a modular fashion to increase power level and employs slight modifications to give additional bandwidth such that one does not have to start from scratch for new designs.

In summary, a number of identical non-uniformly distributed ultra-wideband power amplifier string building blocks are coupled together to form an ultra-wide bandwidth high-power amplifier. The non-uniform distribution results in an amplifier utilizing modular string building blocks that have input and output impedances with only real values. This permits the strings to be replicated and connected together with simple impedance matching. The internal impedance matching associated with the non-linear distribution also absorbs parasitic capacitance to permit the ultra-broadband operation. In one embodiment identical transistors are used for each cell so that the strings may be identically replicated. This permits modular re-use without reconfiguration. In one embodiment a non-uniform distributed power amplifier built using the subject building blocks provides an ultra-wideband multi-octave device suitable for electronic warfare and communications applications, especially to replace traveling wave tubes.

BRIEF DESCRIPTION OF THE DRAWINGS

These and other features of the subject invention will be better understood in connection with the Detailed Description, in conjunction with the Drawings, of which.

DETAILED DESCRIPTION

Figure 1:
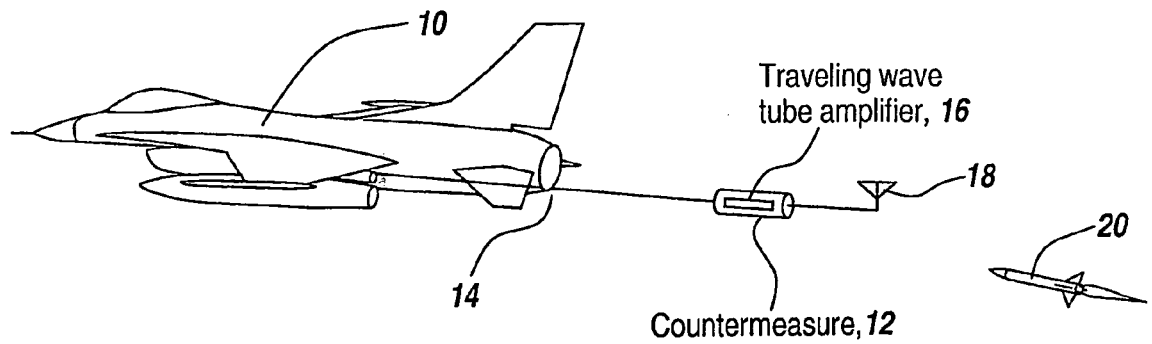
FIG. 1 is a diagrammatic illustration of the use of a traveling wave tube amplifier in a towed countermeasure application, indicating the use of high-voltage lines within the towing line to the towed vehicle.

Referring now to FIG. 1, for electronic warfare applications an aircraft 10 tows a countermeasure vehicle 12 using a towline 14. Vehicle 12 carries a traveling wave tube amplifier 16 coupled to an antenna 18, with the towline in general being a fiber optic cable that, in addition to functioning as a tow cable, transmits control signals and high DC voltage to the traveling wave amplifier.

The purpose of the countermeasure vehicle is to transmit jamming or countermeasure radiation from antenna 18 that is designed to confuse or countermeasure missiles that utilize active radars in their seekers.

Traveling wave tube amplifiers provide broadbanded amplification and are programmed to alter incoming signals from the seeker of an approaching missile 20 and project back the altered signals and amplified versions of the incoming signals towards the missile.

As mentioned hereinbefore, the subject non-uniform distributed amplifier is a solid-state amplifier that replaces the standard traveling wave tube amplifier, and does not require high voltages or fragile tubes.

Figure 2:
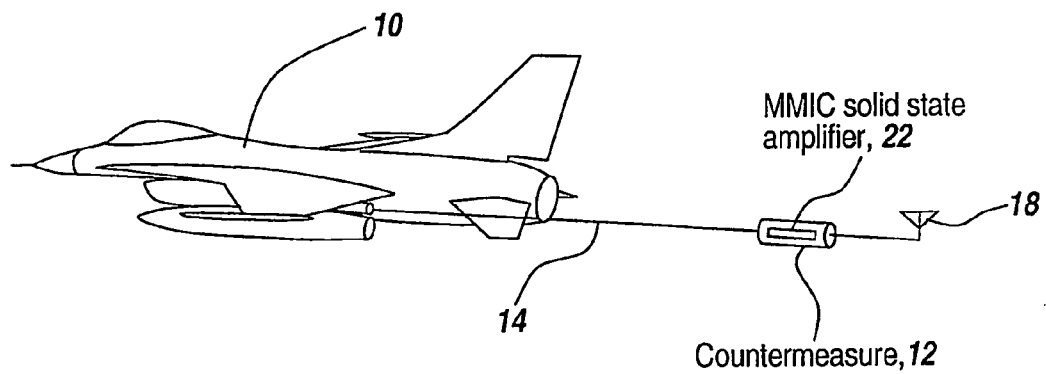
FIG. 2 is a diagrammatic illustration of the substitution of a MMIC non-uniform distributed power amplifier in place of the traveling wave tube amplifier of FIG. 1 to eliminate the problems associated with traveling wave tubes.

Thus, as seen in FIG. 2, a MMIC-implemented, solid-state non-uniform distributed power amplifier 22 is substituted for the traveling wave tube amplifier. The solid-state amplifier is biased by low voltage provided over tow cable 14.

It is the purpose of the non-uniform distributed power amplifier to provide a high-power output over a multi-octave frequency range so as to be able to substitute for the traveling wave tube a much more rugged solid-state, high-power, ultra-broadband amplifier.

Figure 3:
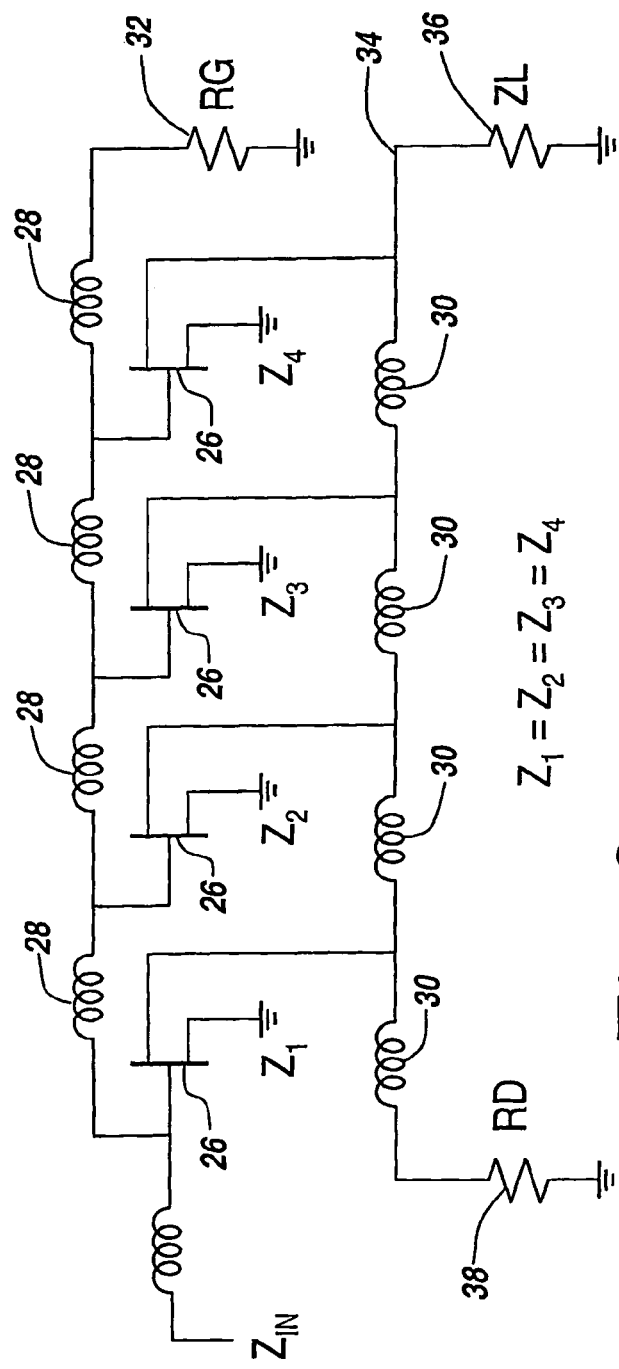
FIG. 3 is a schematic diagram of a prior art solid-state uniformly distributed amplifier utilizing three terminal transistors, illustrating the necessity of providing a drain resistor for the elimination of reflections.

As mentioned hereinbefore, uniformly distributed amplifiers have been built involving, as seen in FIG. 3, a number of three-terminal amplifying devices 26 connected in parallel. It will be appreciated that between each of the stages is an inductance 28 in the gate line and an inductance 30 in the drain line, with the gate line being terminated by a gate resistor 32. The output at drain 34 is applied across a load 36. For uniform distributed amplifiers, a drain resistor 38 is included to limit the reverse wave traveling within the device, so that the amplifier is well matched over broad frequency bandwidths.

A characteristic of such devices is the fact that the impedance at each stage matches the impedance of the follow-on stage. Thus $Z_1=Z_2=Z_3=Z_4$. The result is that in prior art uniform distributed amplifiers, over the operating frequency range, the voltage that each device sees is different. Thus each device would be loaded slightly differently.

The result is that the power delivered by each of the transistors is not maximized. As mentioned before, at one part of the frequency band, one transistor would be delivering more power than the other, and at a somewhat different frequency a different transistor would be delivering more power. Thus, in uniform distributed amplifiers, power is not maximized.

Moreover, since parasitic capacitance increases with the size of the transistors, such amplifiers are typically not utilized as power amplifiers.

Thus, conventional uniform distributed power amplifiers have an inherent disadvantage when it comes to providing high power.

Note that because of the dummy terminations, usually one in the gate line and one in the drain line, one can basically waste 50% of the power due to the use of the drain resistor.

Thus for conventional uniformly-distributed amplifiers the characteristic impedances throughout the amplifier are equal; and the inductances and capacitances are chosen such that the impedance at each cell is equal nominally to 50 ohms in most amplifiers.

Figure 4:
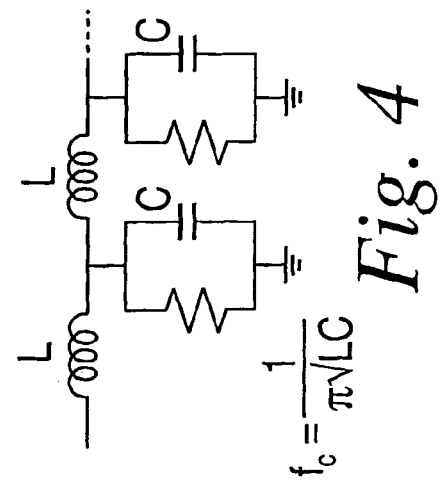
FIG. 4 is a schematic illustration of the equivalent circuit of one of the transistor stages of the amplifier of FIG. 3, illustrating the dependence of the frequency on $1/\sqrt{LC}$ inductance and the capacitance.

As shown in FIG. 4, if one characterizes each of the cells as having a resistor in parallel with a capacitor to ground, with the cells having a large parasitic capacitance it can be clearly seen that the cutoff frequency suffers with increased parasitic capacitance.

Figure 5:
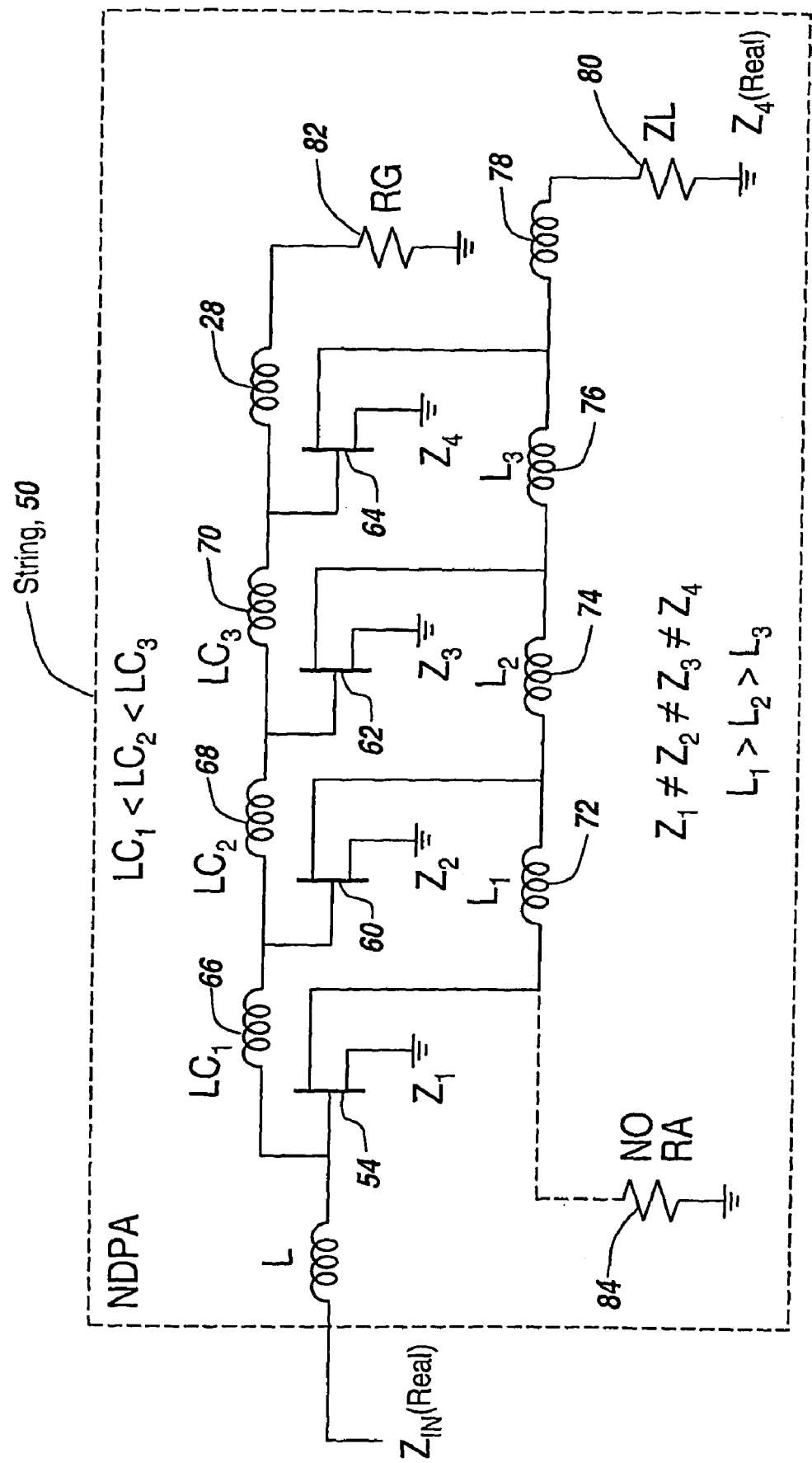
FIG. 5 is a schematic diagram of the subject non-uniform distributed power amplifier, illustrating three terminal transistor cells in which the characteristic impedance for the cells varies from cell to cell and is configured such that the input and output impedances only have real components, with no drain resistor being required, also noting the ascending gate inductances from input to output and decreasing drain inductances from input to output to establish equal voltage/current characteristics for the transistors of the string.

As illustrated in FIG. 5, the subject power amplifier approach utilizing non-uniformly distributed amplifier strings enables realization of high efficiency MMIC power amplifiers capable of ultra-wide frequency bandwidth operation. The approach is to form a traveling wave amplifier composed of cell strings in which each device in the amplifier has identical voltages and currents. Thus in each string, every device must see or is driven by the same voltage.

The easiest method to achieve this is to vary the characteristic impedances of each interconnecting line segment with respect to each other as 1/i. This configuration would maximize gain at the expense of bandwidth. Bandwidth can be increased by artificially lowering the line impedances and the adding a resistive load $R_G$ on the gate line.

The specific inductances L and transmission lines T making up the input and output transmission line segments TLI, TLO are initially selected according to the following procedure. The input and output equivalent circuits can be represented by a shunt RC network. The parallel capacitance is thus compensated with a series inductance such that the resulting L-network approximates the desired line characteristic impedance over a broad bandwidth. The characteristic impedance of the L-network is given by, $$Z0 = \sqrt{L/C}.$$

Therefore the inductance as a function of the required characteristic impedance may be obtained from $$L = Z0^2 \times C.$$

As the operating frequency begins to approach the cutoff frequency defined by, $$f_c = \frac{1}{\pi\sqrt{LC}},$$

the reflection coefficient rises markedly. Since the capacitance usually cannot be reduced because it is determined by the active devices, it is necessary to lower the operating impedance in order to reduce the LC product and raise the cutoff frequency. This tradeoff is usually only necessary in the input network since the input capacitance of FET active devices is typically 10 to 100 times output capacitance.

In the non-uniformly distributed power amplifier of FIG. 5, each active device is located at a junction of two transmission lines of differing characteristic impedance. The equivalent capacitance may be apportioned to inductors associated with the connecting lines so as to maximize the overall cutoff frequency. The maximum will of course occur when $fC_a = fC_b$. Under this condition $$L_a C_a = L_b C_b$$

therefore $$C_a^2 \times Z0_a^2 = C_b^2 \times Z0_b^2,$$

from which $$C_a = \frac{Z0_b}{Z0_a} \times C_b.$$

Since $C = C_a + C_b$,

-continued $$C_a = \frac{C}{\frac{Z0_a}{Z0_b}}, \text{ and } C_b = \frac{C}{\frac{Z0_b}{Z0_a}}.$$

Therefore $$L_a = \frac{Z0_a^2 \times C}{1 + \frac{Z0_a}{Z0_b}}, \text{ and } L_b = \frac{Z0_b^2 \times C}{1 + \frac{Z0_b}{Z0_a}}.$$

If for example the impedances $Z0_a$ and $Z0_b$ are equal, the capacitances $C_a$ and $C_b$ would likewise be equal and equal to ½ of the total device capacitance. Under such circumstances the inductances $L_a$ and $L_b$ would also be halved in order to maintain the same characteristic impedance. The cutoff frequency of the resultant L-sections would be doubled as compared to a single L-section at the same impedance level.

To summarize the method of impedance selection with regard to FIG. 5, the initial theoretical characteristic impedances of input line segments $TLI_1$ through $TLI_n$ are selected so that the same voltage is presented to the gates of each transistor. The characteristic impedance of the input line segment $TLI_3$, for example, is a function of the inductances $L_{13a}$ and $L_{13b}$ and the transmission line $T_{13}$. The bandwidth of the amplifier is determined by the cutoff frequency of the input line segments. The inductances and the transmission lines are chosen to maximize the cutoff while compensating for capacitances of the devices. The resistance $R_G$ in the gate line is used to terminate line segments and prevent reflections.

On the output line, the characteristic impedances of output line segments $TLO_1$, through $TLO_n$ are solely a function of the optimal load resistances $R_{OPT}$ of the devices divided by the position of the segment, i. The inductances $L_{Oia}$ and $L_{Oib}$ are chosen to compensate for the capacitances of the active devices. For example, the capacitance of a transistor $Q_3$ is compensated by $L_{O2b}$ and $L_{O3a}$, with the total required compensating inductance being appropriately apportioned. Output transmission line segments $T_{O1}$, through $TO_n$, are chosen so that the delay along the output line matches the delay along the input line while meeting the required characteristic impedance.

While the above description of the setting of the inductances that are used in segments between transistors, the theoretical values are quite different from the actual values in a realizable circuit.

The values for the inductance, characteristic impedance, and delay (phase) compensation are calculated from the mathematical expressions that relate the device capacitance and resistance characteristics to the desired impedance taper of the gate and drain lines. As will be seen in FIG. 13, these are the initial ideal values for the networks that interconnect the devices (cells) in the non-uniform string. Each network from gate-to-gate and from drain-to-drain is calculated in this manner. The realization of these element values for a MMIC implementation must satisfy multiple physical requirements in addition to the electrical characteristics:

The line widths of the microstrip traces in the drain line must be wide enough to handle the current in that portion of the amplifier. This will be a function of where the drain bias is injected. If the string is biased from the output end of the string, the microstrip trace at the output must be wide enough to handle all of the bias current, or $n \times Ids_n$. The microstrip traces between the last device and the preceding device must handle $(n-1) \times Ids_n$. This proceeds to the first device in the string.

The total length of the microstrip traces between the devices must be long enough to allow their physical layout without overlap. Also, the total gate-to-gate length of the traces and the total drain-to-drain length of the traces must be compatible for layout. For very wide lines, with minimal bending possible, this is equivalent to saying that their total lengths are roughly equal. In areas of low current handling, or in the case of the gate line, the narrower line widths allow meander, or bent traces, and this constraint is relaxed.

The overall electrical characteristics of the device-to-device interconnect are more important than the individual element values of that interconnection. This is due to the constraints imposed by the physical layout, which were mentioned previously. Using computer aided design software, such as Agilent's Advanced Design System (ADS), the ideal-element to microstrip-trace equivalent is accomplished.

As will be seen, the subject design methodology exploits the advantages of using small gate-periphery, high-efficiency transistor devices or cells in a distributed monolithic cascade of solid-state devices interconnected with transmission lines of progressively varying characteristic impedance.

Note that when utilizing multiple cells, one has a transmission-line characteristic impedance in a so-called artificial transmission line that changes as one moves through the amplifier. The highest-impedance part on the load side is at the first transistor cell and it steps down to the load impedance, which may not be 50 ohms. On the gate side, the highest impedance also steps down and does not necessarily equal 50 ohms.

Here a non-uniformly distributed power amplifier is in the form of a string 50 that exhibits a real impedance at its input and output terminals over several octaves of frequency bandwidth, enabling simplified low-pass and band-pass impedance-transforming networks to be used to combine several strings into a wideband, high-power amplifier MMIC of a prescribed output power. In this case, there is an input $Z_{in}$ that is real, which is applied across an inductor 52 to the gate of a first transistor 54, which has a grounded source and an output at drain 56. The FET transistors, here illustrated at 54, 60, 62 and 64, are connected in parallel such that their gates and drains are connected together as illustrated. Between each of the transistorized gain stages is a gate inductor, respectively 66, 68 and 70, with the drains being interconnected through inductors 72, 74 and 76.

Note that as mentioned above, the output is across a load 80, which has a real load impedance, with the gate being terminated in a real load 82, e.g., $R_G$.

As will be appreciated, the value of the gate inductors decreases from a high at the input end to a low at the output end, whereas the inductors for the gates increase from the input end to the output end.

The transistors themselves are identical so that the impedances of the cells are purposely made unequal by configuring the inductances such that across all frequencies the current/voltage characteristics of the transistors are identical.

What will be seen is that, with the currents and voltages equal, there is no need for a drain resistor 84 that would rob the amplifier of power.

Having provided a string composed of individual cells, and making the input and the output impedances exhibiting only real components, it is possible to replicate identically configured strings as building blocks and interconnect them together for power amplification purposes.

Figure 6:
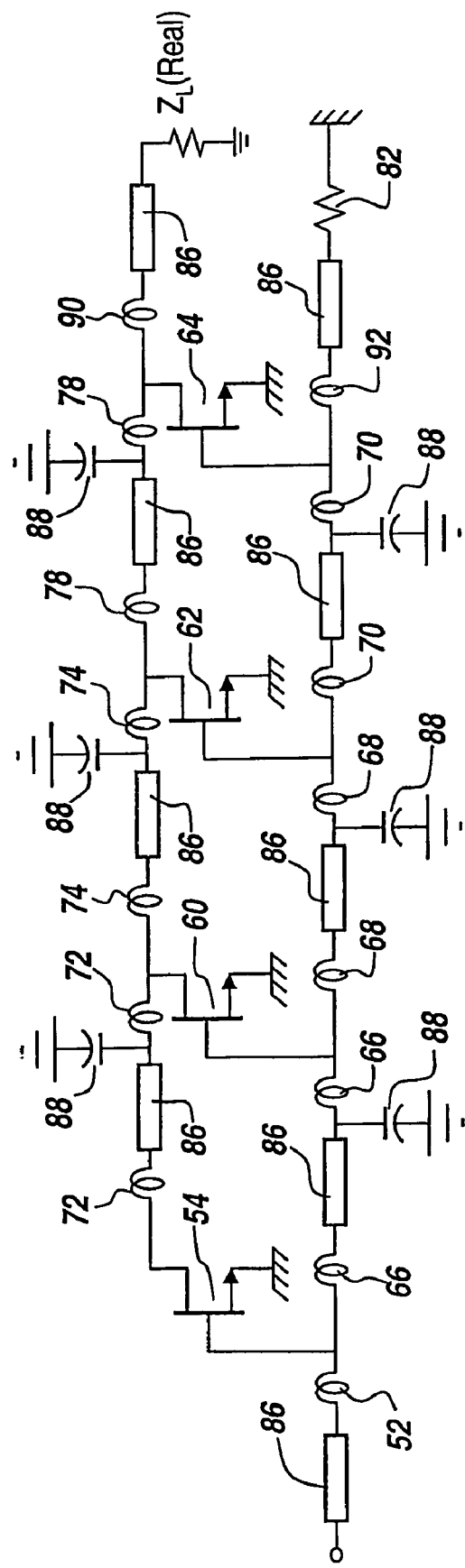
FIG. 6 is a schematic diagram of the string of FIG. 5, indicating the inter-device inductances and transmission line lengths, with the inductances and phase matching set by the traces associated with the drain or the gate of the transistors.

The equivalent circuit to FIG. 5 is shown in FIG. 6 in which like elements have like reference characters.

It will be appreciated that the transmission line between each of the stages is configured to present not only a particular inductance, but the length of line, here illustrated at 86, is designed for phase matching purposes such that phase coherence is preserved from one amplification stage to the other.

As shown, there is extensive use of small MIM capacitors 88 to dielectrically load the transmission lines, lowering their equivalent characteristic impedance and raising their equivalent dielectric constant.

It is noted that the inductors straddle the associated transmission line 86 used for phase matching. Moreover, an inductor 90 is inserted at the output of the output transistor and an inductor 92 is inserted at the gate line of the output transistor.

Having established that the voltages and currents are the same across each of the transistors, one maximizes the power output with respect to frequency, while at the same time providing that the input impedance and the output impedance have no virtual components.

This internally matched aggregate power chip is capable of significantly higher monolithic chip power over a broader frequency bandwidth than is currently available with conventional circuit approaches.

Important to note is that the non-uniform distributed power amplifier strings may be replicated such that the design may be re-used to greatly facilitate extending the design approach to higher power levels without the requirement of extensive new designs. Thus the subject building blocks offer the potential for the highest output power-bandwidth figure of merit that can be achieved using a single chip integrated circuit implementation.

A wide variety of broadband power amplifiers with varying output power levels can thus be achieved with only one type of fundamental transistor cell in a monolithic cascade of transistors that constitutes a string. The power level of the MMIC chip is selected by integrating the appropriate number of strings using simple low pass or band passed impedance matching networks, which enables the semiconductor fabrication process to focus on developing a single small, highly efficient device with the highest per-unit performance obtainable. Thus the amplifier design becomes decoupled from the device development and optimal amplifier configurations can be achieved without the need to develop multiple gate periphery and application-specific devices. Moreover, the architecture of higher-power designs permit revising the strings, lowering design cycle time and associated design costs for high-power amplifiers.

The non-uniform distributed nature of the amplifier offers several inherent reliability enhancements not readily available from conventional wideband power amplifiers. These include the fact that each device in the string array is stressed equally, meaning that each device experiences identical voltages and currents. Moreover, the thermal dissipation is more distributed when contrasted with very large-periphery power transistors used in conventional amplifier circuits. This enables non-uniform distributed power amplifier MMICs to exhibit lower junction temperatures from reduced proximity heating.

The tightly integrated device and circuit relationship of these amplifier strings provides a flexible circuit approach that overcomes the band limiting and higher circuit loss environments of conventional power amplifier approaches. Each string is designed in a manner that absorbs the individual device parasitic capacitance within the string, enabling broader bandwidth and lower loss filter matching networks. In addition, the impedance presented over extended frequency bandwidths at each input and output of a string is nearly real and higher than that of a comparable-sized unmatched large periphery power transistor. These features result in higher impedance transformation ratios when combining several strings, facilitating inherent broadband performance. The overall output power level of the non-uniform distributed power amplifier MMIC is set by the number of device cells arrayed or integrated in each string and by the total number of strings on the chip. The real impedance feature of the strings significantly facilitates impedance transformation networks that evolve the strings into single internally-matched power amplifier MMICs that are completely compatible with, but not limited to, current wafer fabrication techniques.

Figure 7:
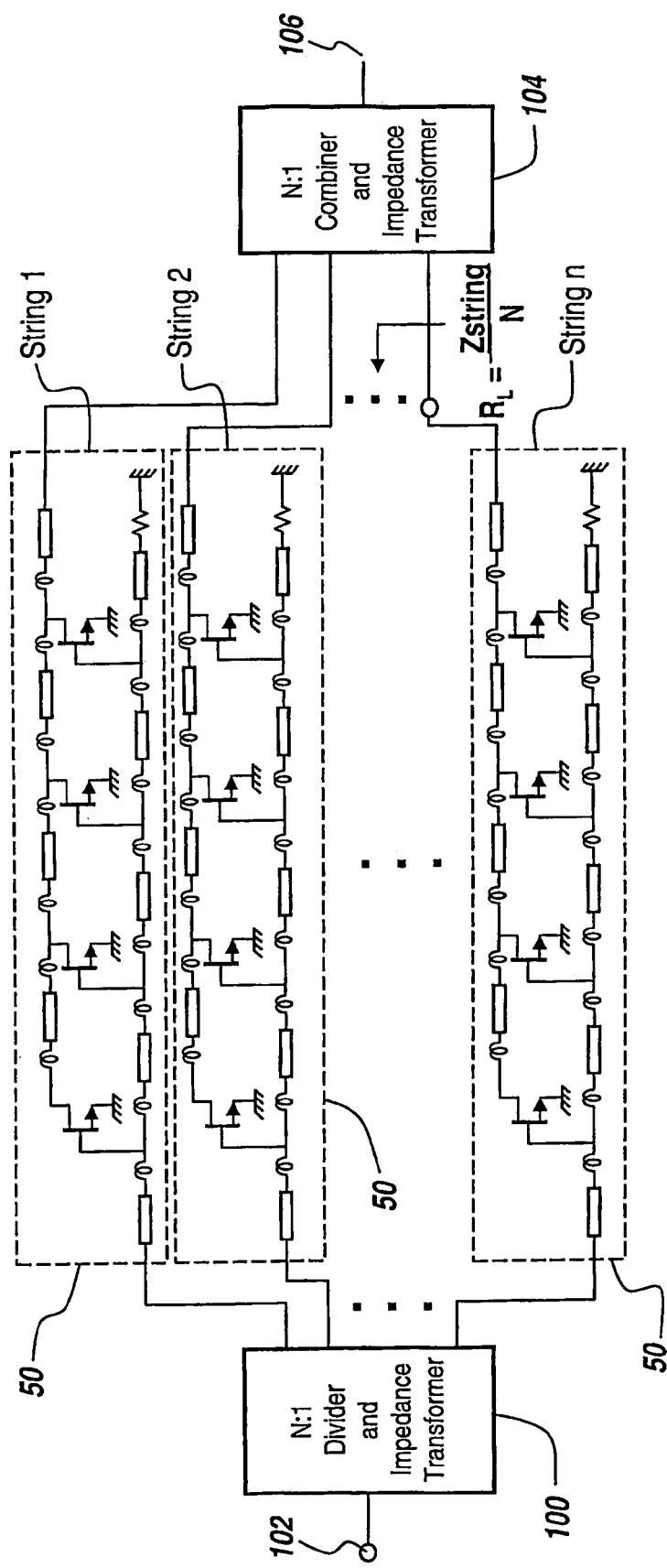
FIG. 7 is a schematic illustration of the paralleling four strings to provide an ultra-wide bandwidth amplifier with increased power output, showing the use of a divider and an impedance transformer at the input and combiner, and an impedance transformer at the output.

Referring now to FIG. 7, one can parallel-connect a number of strings 50 as illustrated utilizing a simple N:1 divider and impedance transformer 100 to split and match an input at 102 and apply it to the gate terminals of the transistors in each of the strings.

The drains of the strings are combined by a combiner and impedance transformer 104 to provide the amplified output at 106.

Because of the topology used in these MMICs, it is possible to use low pass impedance matching and combining networks. This is due to the fact that both topologies, namely the low pass impedance matching topology and the combining network topology, are low pass networks. These matching or combining networks can thus be made in the conventional low pass form and can be synthesized from general filter theory, although band pass and high pass networks of lumped or distributed form are within the scope of this invention.

The subject topology is quite different from the Chick array because his combining networks have very specific values and while there is some flexibility in choosing these values by correctly choosing the number and size of the transistors, the realizability is constrained by current handling, physical proximity of the transistors, the dimensions of the traces, and the need for numerous crossovers.

Figure 8:
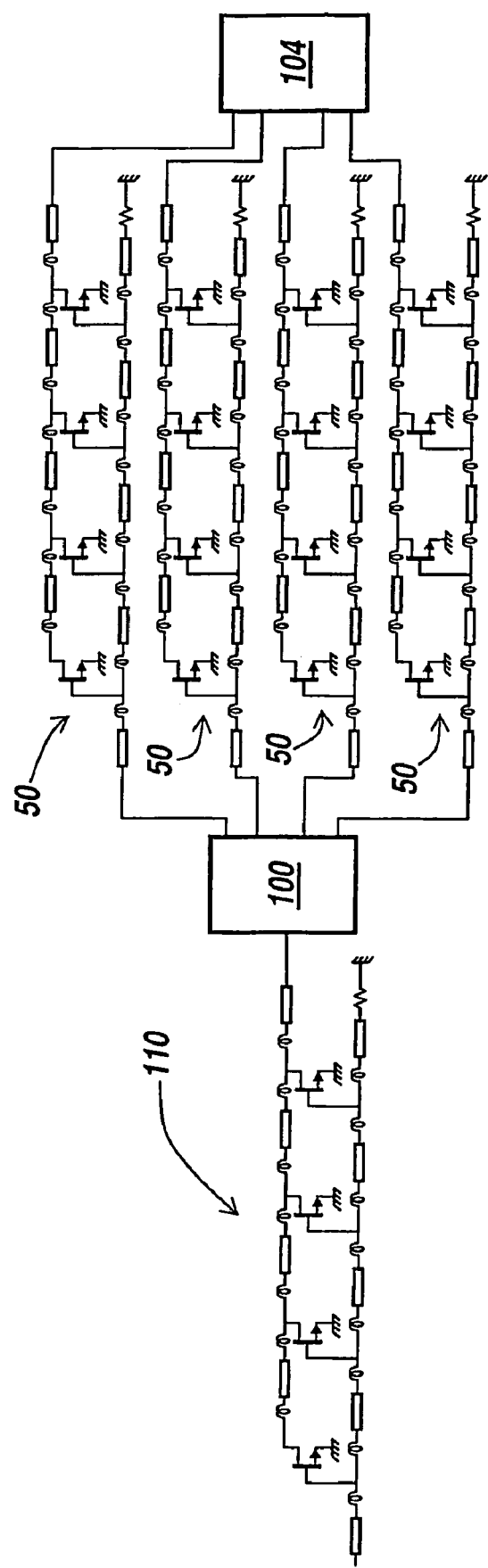
FIG. 8 illustrates the driving of the four strings of the distributed amplifier of FIG. 7 with an identically configured string driver.

Referring now to FIG. 8, one way in which a solid-state power amplifier can be formed is to take the parallel-connected strings of FIG. 7 and drive them with an identically configured string 110, which is coupled to the divider and impedance transformer 100 described above.

As to the output impedance for either the FIG. 7 or 8 embodiments, the impedance match required is from the resistive load, which is equal to $ZL_{string}/N$, where N is the total number of strings, to $ZL_{amplifier}$, which is generally 50 ohms.

Figure 9:
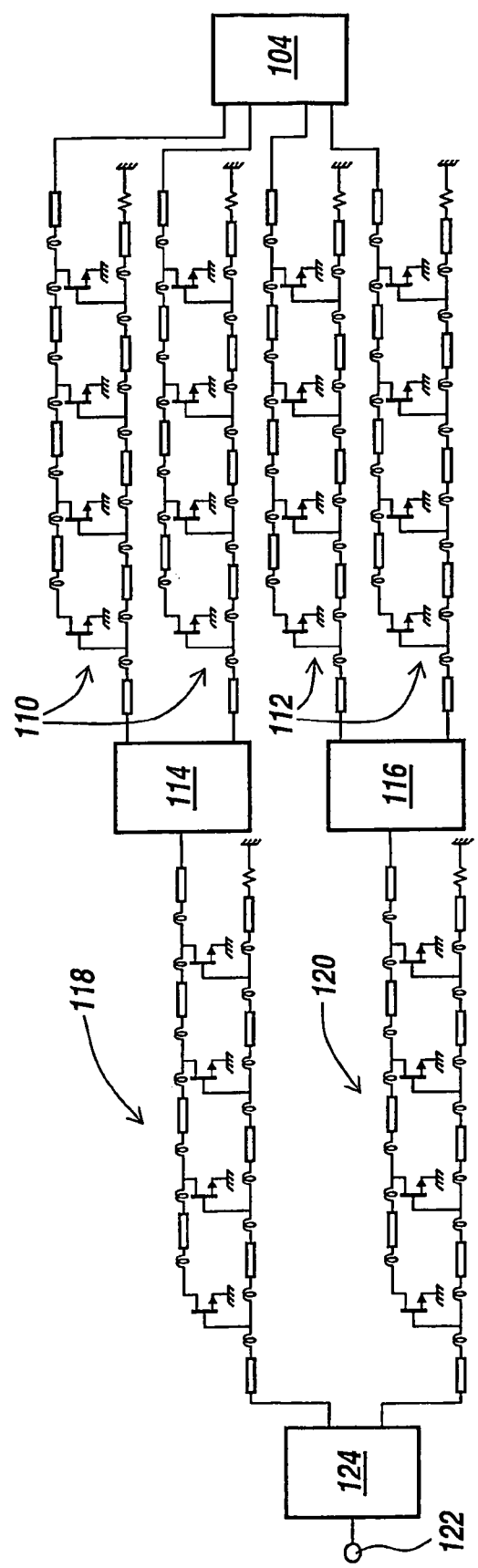
FIG. 9 is a schematic diagram of the driving of two halves of a four-string power amplifier stage using two separate drivers, each composed of a string.

Referring to FIG. 9, another way to drive the four strings of FIG. 7 is to divide the power amplification stage into pairs of strings shown by pairs 110 and 112; and by providing each of the pairs with a separate divider and transformer as illustrated respectively at 114 and 116. Dividers 114 and 116 are separately driven by strings 118 and 120, in turn driven by an input 122 that is itself divided out and provided with an impedance transformer as illustrated at 124.

Figure 10:
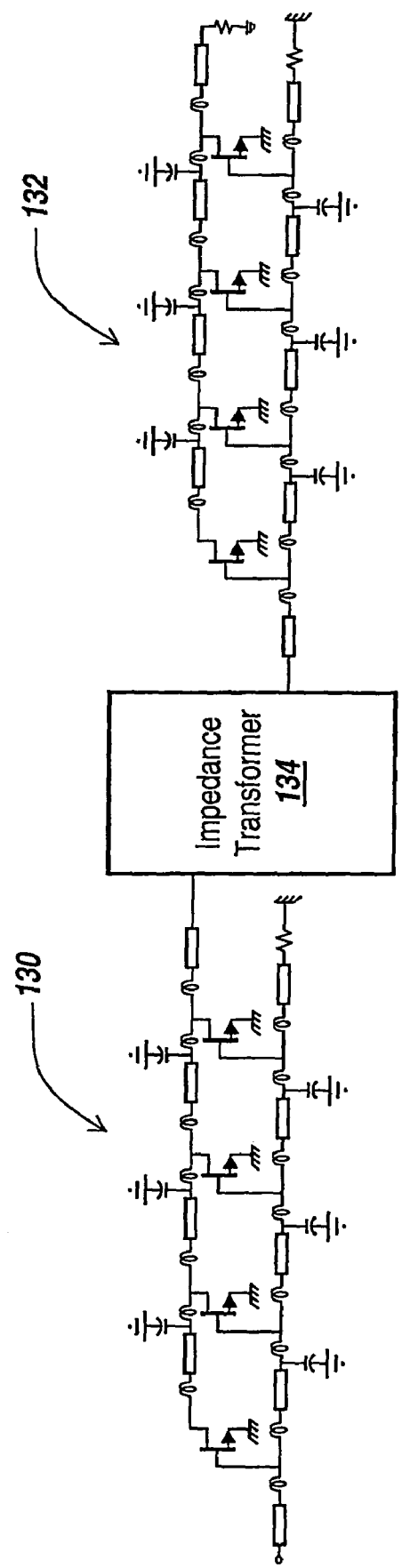
FIG. 10 is a schematic illustration of the cascade of one string with another with an integrated impedance transformer.

Referring to FIG. 10, what will be seen is that, while one can have a parallel connection of the strings, one can likewise take a string 130 and cascade it to a string 132 through an impedance transformer 134.

Figure 11:
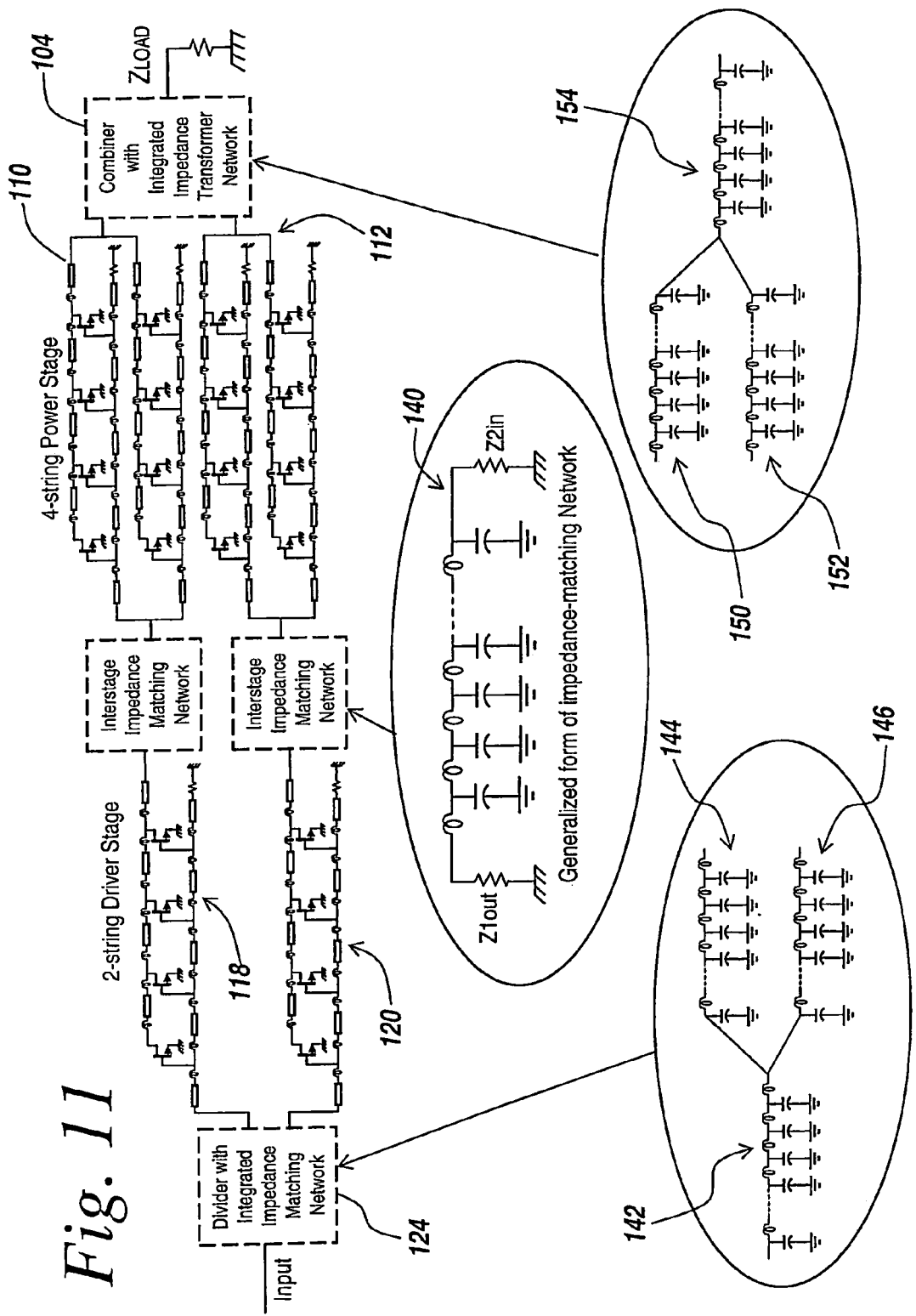
FIG. 11 is a diagrammatic illustration of the generalized form of impedance matching network for use in coupling strings together, also showing a divider and combiner fabricated together with associated impedance matching using the same topology.

Referring now to FIG. 11, what is shown is that if one is using a two-string driver stage comprised of strings 118 and 120, the divider, here illustrated at 124, can take the form of an impedance matching network 140, which includes a series of L elements, each composed of an inductor and a capacitor. Thus the impedance matching is performed between the input and the divider section by an L network 142, which is then outputted through strings 144 and 146 that operate as the divider portion of the circuit. What will be seen is that it is relatively easy to construct the divider and matching network using the same low pass filter topology.

Likewise, for the four-string power stage comprising the double strings 110 and 112, combiner and impedance transformer network 104 may be formed by impedance matching networks 150 and 152 coupled together with an impedance matching network 154.

It is noted that the matching between the two-string driver stage and the four-string power stage is accomplished through a simple inter-stage impedance matching network, namely network 140.

What will be seen, therefore, is the ability to make a broadband, multi-octave, high-power amplifier by simply stringing together or coupling together various of the building block strings, with the impedance matching and combining and dividing done through the use of simply-constructed low pass filter devices.

It is noted that the impedance matching networks and integrated combiner/dividers are relatively easy to fabricate in MMIC topology. The matching networks are basically derived from filter synthesis and can be maximally flat or Chebyshev networks of a sufficient number of sections to achieve the required bandwidth.

Figure 12:
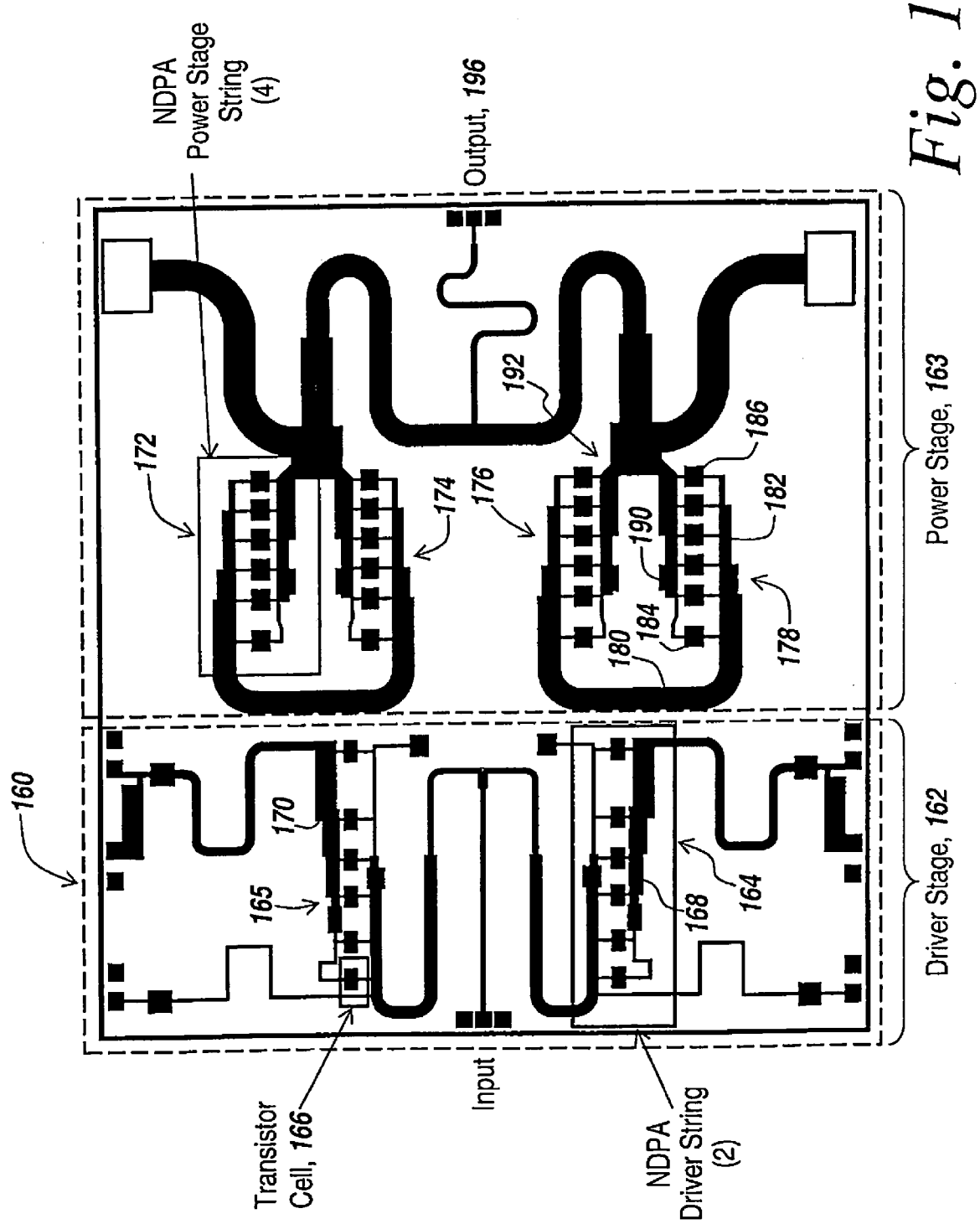
FIG. 12 is a top view of the topology for the driver stage and a power stage of a high-power ultra-wide bandwidth amplifier, with each of the stages utilizing the non-uniform distributed power amplifier strings as modular building blocks.

Referring now to FIG. 12, the implementation of a power amplifier using MMIC technology can be accomplished in one embodiment that corresponds to the circuit of FIG. 11 that can be monolithically formed on a chip, here designated chip 160. The amplifier, built up of non-uniform distributed amplifier strings, includes a driver stage 162 and a power stage 163.

As to the driver stage, there are two monolithically formed non-uniform distributed amplifier strings 164 and 165, with each of the FET transistors denoted by the transistor cell 166.

The strings are parallel-connected FET transistor amplifiers interconnected with traces that form both inductors and phase matching segments. The traces that form the output to these devices are stepped inductor traces 168 and 170.

The power stage includes four strings, here labeled strings 172, 174, 176 and 178. Referring now to string 178, the traces to the left labeled 186 form the aforementioned divider and impedance transformer between the output of string 166 and the input to strings 176 and 178.

What will be seen at the right side of these traces is a stepped structure, designated 182, that steps the impedance on the gate electrodes from the first transistor 184 to the last transistor 186, such that the associated inductance successively increases from input to output.

As to the drain electrodes of these devices, the inductances formed by traces 190 form inductances between the transistors that successively decrease from input transistor 184 to output transistor 186. Strings 176 and 178 have their outputs combined by trace 192, which functions to combine the outputs, to inject the drain bias, and to perform an impedance matching function.

How the traces are configured is now described.

Figure 13:
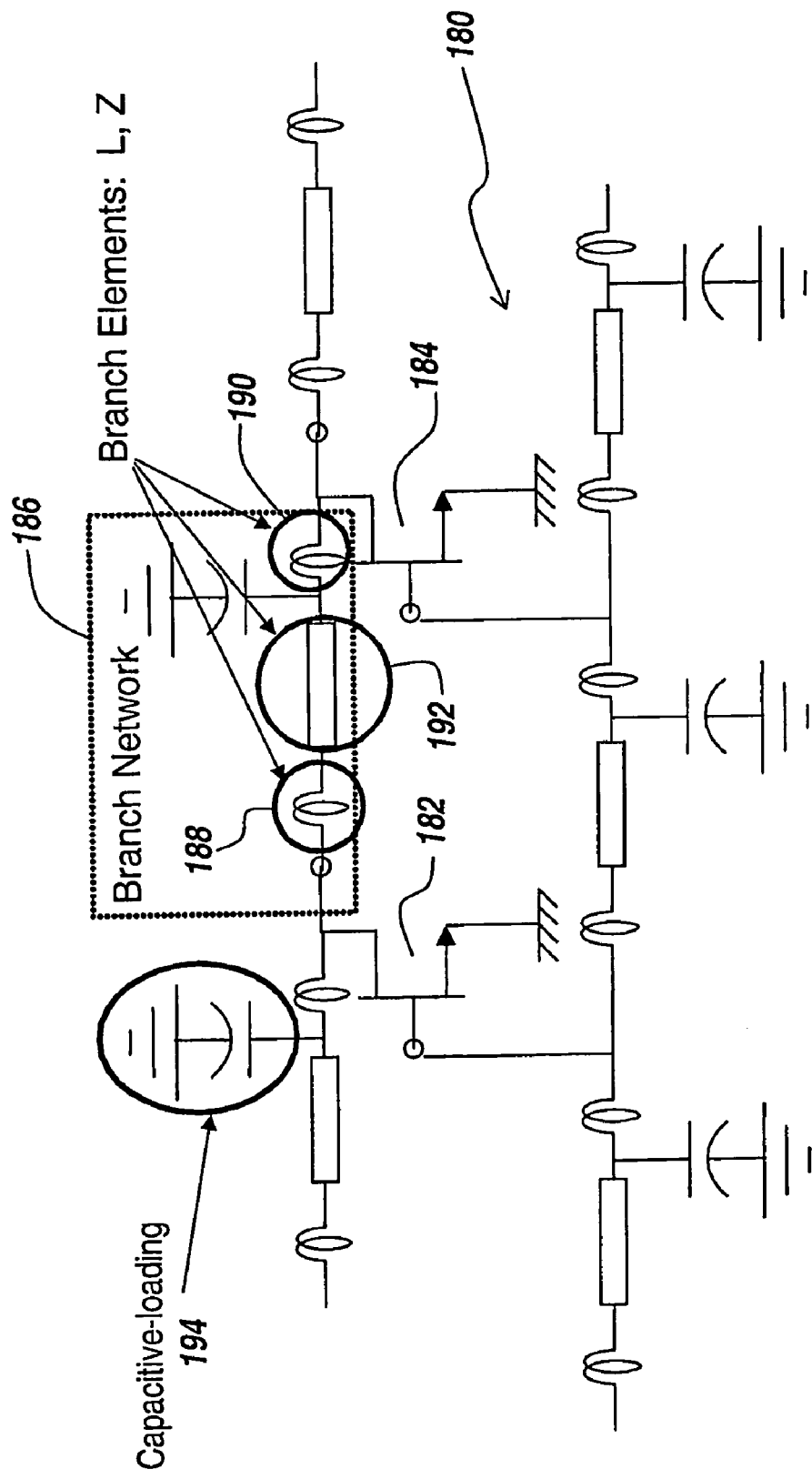
FIG. 13 is a schematic diagram showing a branch network with branch elements L and Z, also showing capacitive loading between transistor stages.

Referring now to FIG. 13, what is shown is a string 180 that employs transistors 182 and 184 that are interconnected using a branch network 186 having elements L and Z as shown at 188 and 190 for the inductors and as an impedance-matching element 192.

Note also that each of the capacitors 194 result in capacitive loading.

While the initial values of the inductance between the transistors can be theoretically calculated, these theoretical values cannot be translated into the microstrip design. In fact, a microstrip designer would be hard pressed to find the inductors and impedance-matching elements in the finished design. Thus, as can be seen in FIG. 13, one has definitions for the device-to-device interconnects, which constitute the branches between the transistors.

Figure 14:
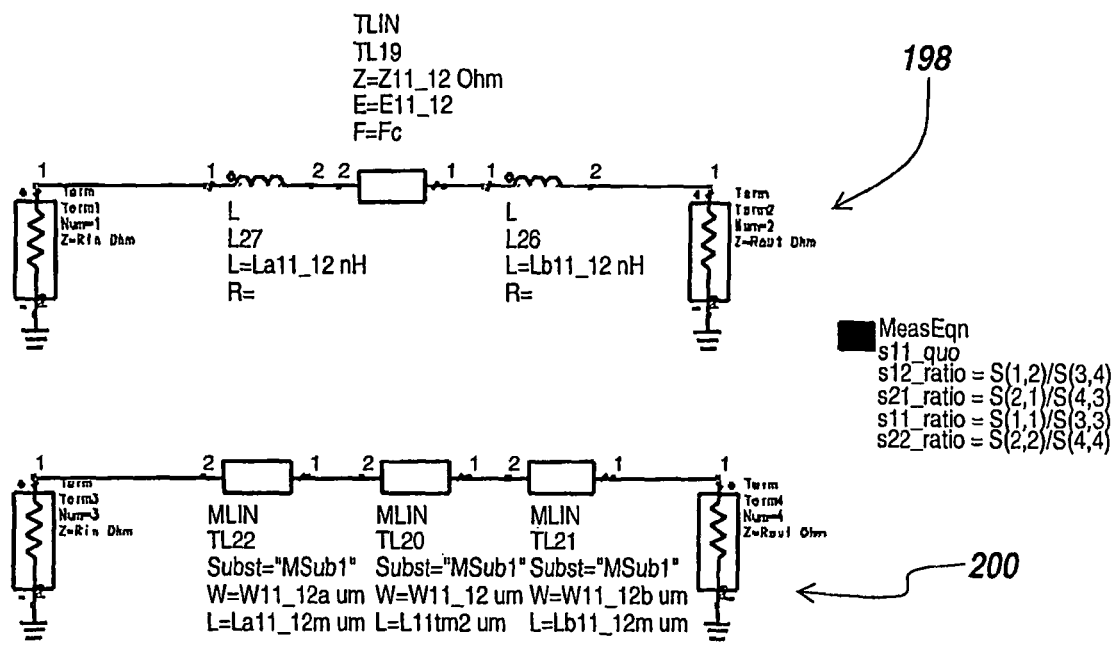
FIG. 14 is a diagrammatic illustration and table showing the setting of a microstrip trace network equivalent to an ideal network; and, FIG. 15 is a diagrammatic illustration of a low-impedance line modeled as a narrow line with discrete capacitors in which, for a MMIC, the capacitors are metal-insulator-metal, MIM, capacitors.

How these elements are realized in MMIC topology is shown in FIG. 14. Here the network 198 interconnecting the devices (i.e., branch network), with two inductances (i.e., L) and a length of transmission line with characteristic impedance, Z, is set equivalent to a microstrip network 200. The microstrip network shown has three elements. In some cases, the required equivalent network can have more elements. The ratio of the S-parameters of the two networks (i.e., the L-Z-L network and the microstrip network) is optimized for equivalence over a specified bandwidth, nominally a frequency higher than the lowest cutoff frequency in the string. During the optimization the widths of the microstrip traces are constrained for current handling and for foundry design rule minima. The sum of the branch network lengths is constrained for physical layout connection. For low-impedance lines, where line widths become very wide, the constraint may also include a maximum line width to avoid potential moding problems and to avoid additional layout problems associated with such wide traces. In these cases, the low-impedance line can be further approximated by a narrower microstrip trace, periodically loaded with small discrete capacitors, as shown in the FIG. 15. In general, the first devices in the gate line and the last devices in the drain line, where the lowest impedances in the string occur, are likely to require this modification.

The networks are not limited to microstrip but can be realized in coplanar waveguide, stripline, or any suitable planar form.

As see in FIG. 14, there are phase goals and magnitude goals for which the three elements in circuit 200 are to be set.

Figure 15:
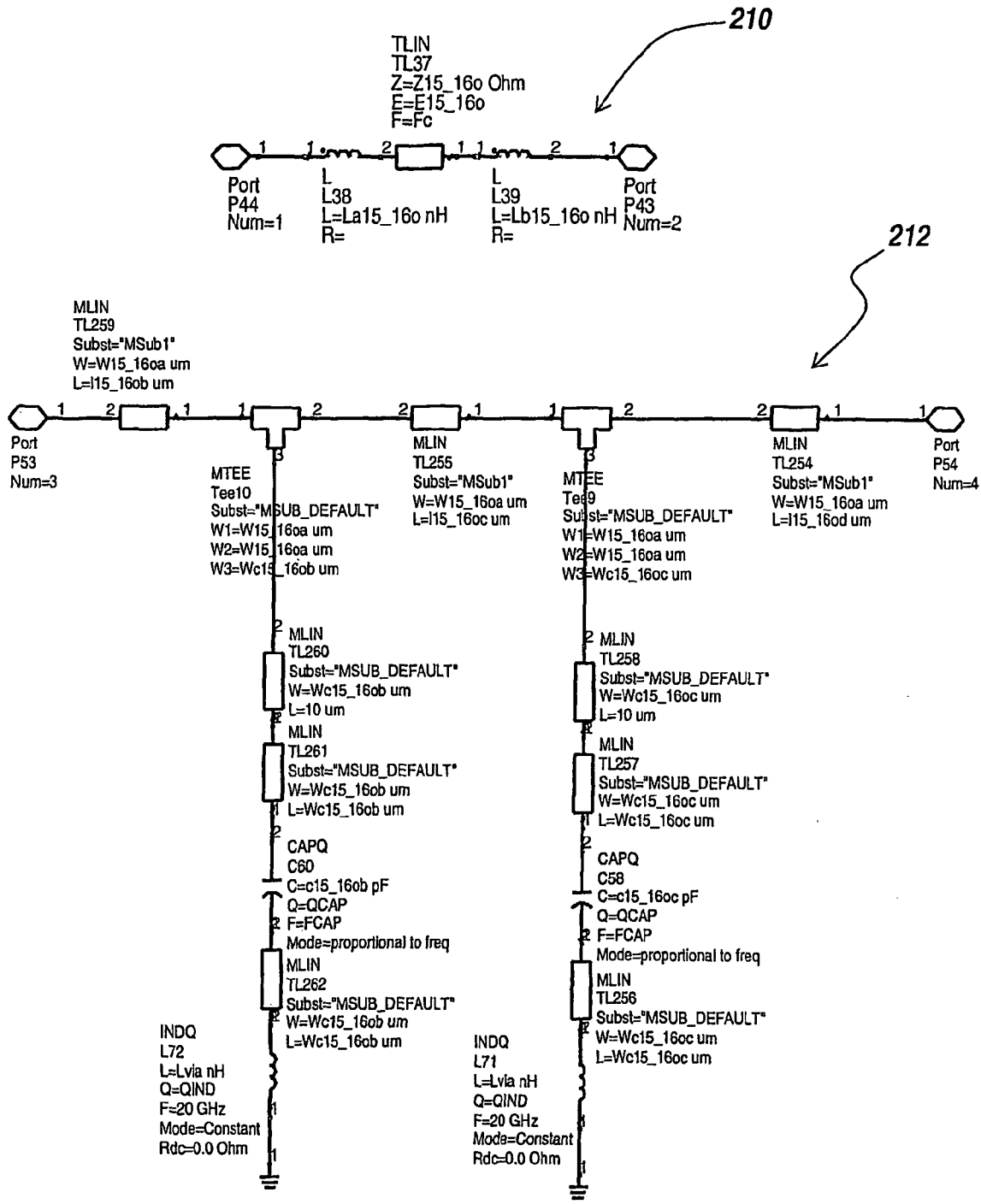

Referring now to FIG. 15, for a low-impedance line 210, this line can be modeled as a narrow line 212 with discrete capacitors. For a MMIC these are metal-insulator-metal, MIM, capacitors.

FIG. 15 thus shows the model for the low-impedance line.

How the microstrip technology is configured is determined using the Agilent Advanced Design System simulation analysis.

What follows is a description of how this computer-aided design software results in specific trace dimensions.

Optimization of the S-parameters of the trace network to the S-parameters of the ideal network requires equivalence of phase and magnitude over a frequency range denoted $f_{LO}$ to $f_{HI}$. A numerical weighting function is applied to the various parameters allowing a degree of freedom in the equivalence fitting. The experienced designer will set constraints on the trace parameters' width and length, as mentioned previously. An iterative process will result in a trace network satisfying physical connectivity constraints and electrical equivalence. More trace elements, or capacitive loading, may be required to improve the fit to the desired ideal network. This iterative process is performed for each transistor-to-transistor interconnect network throughout the amplifier string. It is important to note that no unique solution exists and therefore, considerable freedom is given to the design engineer to determine the interconnect networks. It is this flexibility of form, and degree of electrical equivalence, that permits the physical realizability in MMIC form.

It is noted that the traces between the transistors function both to provide the required inductances and to perform phase matching in terms of their length such that throughout the string the outputs of the various transistor amplifiers within the string are in phase.

Note that the combined outputs of strings 172 and 174 are combined with the combined outputs of strings 176 and 178 to provide a final combined output as illustrated at 196, which is the output of the power stage of amplifier 160.

What makes it possible to combine the strings in the manner noted is that the inputs and outputs of the strings are composed only of real components to facilitate inter-string matching.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A solid-state microwave multi-octave power amplifier, comprising:
a number of interconnected non-uniform distributed amplification modular building blocks, each of said modular building blocks including a non-uniform distributed amplifier string comprised of a number of transistor amplification stages interconnected by inductors and wherein the values of said inductors are set such that the voltage and current associated with one of the gain stage transistors is equal to that associated with that of the transistors of the other stages to facilitate maximum power transfer and matching between interconnected modular building blocks, said inductors having values that are set such that the impedance associated with one of the transistor amplification stages is not equal to the impedance associated with an adjacent transistor amplification stage, and further including a phase matching element in series with the inductor between the transistor amplification stages.

2. The amplifier of claim 1, wherein each of said modular building blocks has an input and an output with only real components.

3. The amplifier of claim 2, and further including impedance transformers connected between the modular building blocks.

4. The amplifier of claim 3, wherein said impedance transformers include a multi-section filter network.

5. The amplifier of claim 4, wherein said multi-section filter network is tuned with only real values, thereby eliminating the requirement to consider reactance values.

6. The amplifier of claim 1, wherein all of the transistors in said string are identical.

7. The amplifier of claim 1, wherein each of said amplification stages has an identical voltage/current characteristic brought about by assigning impedances between transistor gain stages in a non-uniform manner such that the impedance associated with one gain stage is not equal to the impedance associated with an adjacent amplification stage, such that the characteristic impedance of the string is made to vary throughout the distributed amplifier.

8. The amplifier of claim 1, wherein the transistors in the said gain stages are field-effect transistors and wherein the non-uniform impedance distribution avoids the use of drain line termination.

9. The amplifier of claim 1, wherein the parasitic capacitance for the amplification stages is absorbed so that said string has an ultra-wide bandwidth.

10. The amplifier of claim 1, wherein the impedance of said string is tapered such that from input to output of a string in providing a non-uniform impedance distribution the impedance of each interconnection between the amplification stages varies with respect to 1/i.

11. The amplifier of claim 10, wherein said amplification stages include field-effect transistors and wherein the drain inductance values successively decrease from input to output and wherein the gate inductance values successively increase from input to output.

12. The amplifier of claim 1, wherein the amplifier built from the interconnection of said modular building block strings has a flat power output across the entire bandwidth.

13. A method for forming an ultra-wideband solid-state power amplifier having a constant output power over the frequency band, comprising the steps of:

providing a number of non-uniform distributed amplifier strings, each having a number of transistor amplification stages interconnected by inductors in which there is an inductor between transistor amplification stages, each of the transistor amplification stages having input and output impedances with only real values; and, interconnecting the strings such that the interconnected strings form a solid-state amplifier having a multi-octave bandwidth and an output that does not fluctuate across the bandwidth, the interconnecting step including providing a phase matching element in series with the inductor between transistor amplification stages.

14. The method of claim 13, wherein the interconnecting step includes connecting selected strings in parallel.

15. The method of claim 13, wherein the interconnecting step includes connecting selected strings in a series cascade.

16. The method of claim 14, wherein one of said strings functions as a driver having an output and further including the step of using the output of the driver string to drive a number of the parallel-connected amplifier strings.

17. The method of claim 16, wherein the interconnecting step includes interposing an impedance divider and transformer between the driver strings and the parallel-connected amplifier strings.

18. The method of claim 16, and further including the step of driving selected power amplifier strings with a plurality of driver strings.

19. A method for providing a substitute for a traveling wave tube amplifier for use in a towed countermeasure application, comprising:

substituting a solid-state multi-octave non-uniformly distributed power amplifier for the traveling wave tube amplifier, the solid-state power amplifier including a number of interconnected modular, non-uniformly distributed amplifier strings as modular building blocks such that the bandwidth of the interconnected strings acquires the bandwidth of the individual strings, whereby interconnecting non-uniformly distributed amplifier strings preserves the ultra-wide bandwidth of each of the strings, each string having a number of transistor amplification stages interconnected through an inductor and a phase matching element in series therewith.

* * * * *